United States Patent [19]
Adachi

[11] Patent Number: 5,579,258
[45] Date of Patent: Nov. 26, 1996

[54] FERROELECTRIC MEMORY

[75] Inventor: Hideo Adachi, Iruma, Japan

[73] Assignee: Olympus Optical Co., Ltd., Tokyo, Japan

[21] Appl. No.: 982,570

[22] Filed: Nov. 27, 1992

[30] Foreign Application Priority Data

Nov. 28, 1991 [JP] Japan .................................. 3-314508
Mar. 25, 1992 [JP] Japan .................................. 4-67275

[51] Int. Cl.⁶ .................................................. G11C 11/22
[52] U.S. Cl. ........................................ 365/145; 365/148
[58] Field of Search ................................. 365/145, 148, 365/117

[56] References Cited

U.S. PATENT DOCUMENTS

| | | | |
|---|---|---|---|
| 4,259,728 | 3/1981 | Geary et al. | 365/145 X |
| 5,060,191 | 10/1991 | Nagasaki et al. | 365/145 |
| 5,338,951 | 8/1994 | Argos, Jr. et al. | 365/145 X |

FOREIGN PATENT DOCUMENTS 3-108192  5/1991  Japan .
3-108769  5/1991  Japan .

*Primary Examiner*—Do Hyun Yoo
*Attorney, Agent, or Firm*—Frishauf, Holtz, Goodman, Langer & Chick

[57] ABSTRACT

A nondestructive readout ferroelectric memory device for writing/reading information by reversing/not reversing a ferroelectric polarization state, and a method for manufacturing the same includes a ferroelectric memory cell array having ferroelectric memory cells arrayed in matrix and each having a nonlinear resistor of $ZnO/Bi_2O_3/ZnO$, a ferroelectric substance, and an intermediate electrode of Pt interposed therebetween, and upper and lower electrodes intersecting each other and interposing the ferroelectric memory cells, or a ferroelectric memory cell array having ferroelectric memory cells arrayed in matrix and each having a nonlinear resistor both surfaces of which are covered with high-melting point metal and which is formed of a varistor thin film of $(Sr_{1-x}CaX)TiO_3+MeO$ formed by thermal treatment of metal alkoxide compound mixing liquid (precursor), a ferroelectric thin film of $Pb(Zr \cdot Ti)O_3$, and an intermediate electrode of Pt interposed therebetween, and upper and lower electrodes intersecting each other and interposing the ferroelectric memory cells. The above ferroelectric memory cell array includes x and Y decoders for selecting a desired ferroelectric memory cell and a voltage generator for applying a predetermined voltage only to a nonlinear resistor of the selected ferroelectric memory cell.

44 Claims, 9 Drawing Sheets

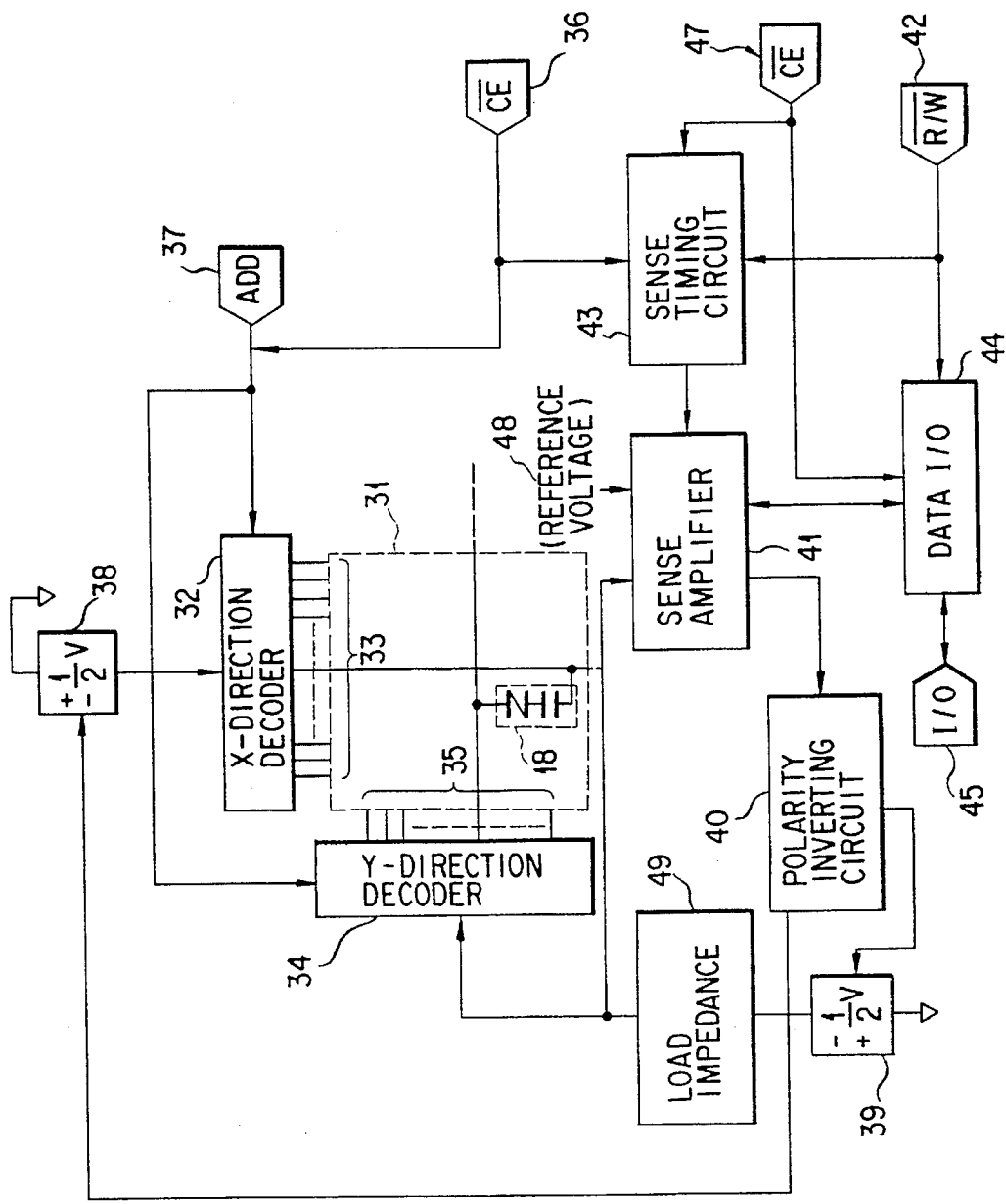
F I G. 5

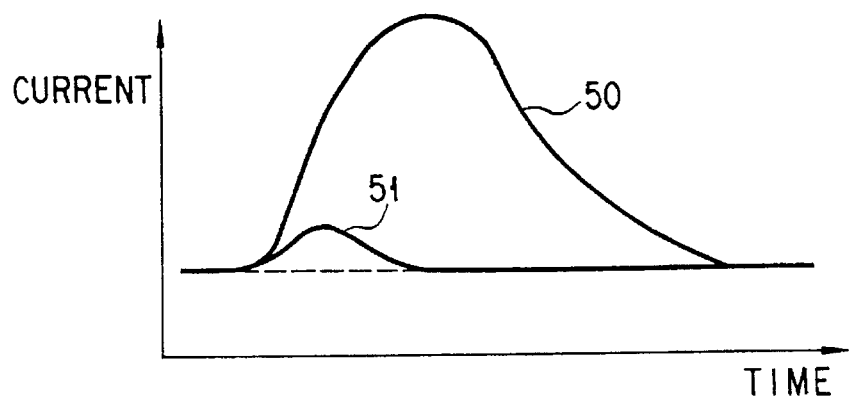
F I G. 6
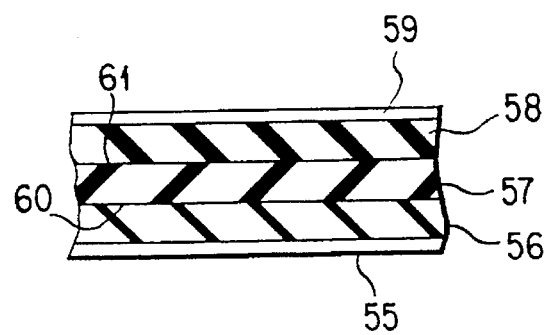
F I G. 7A
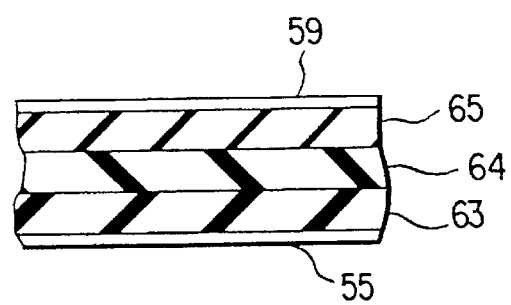
F I G. 7B

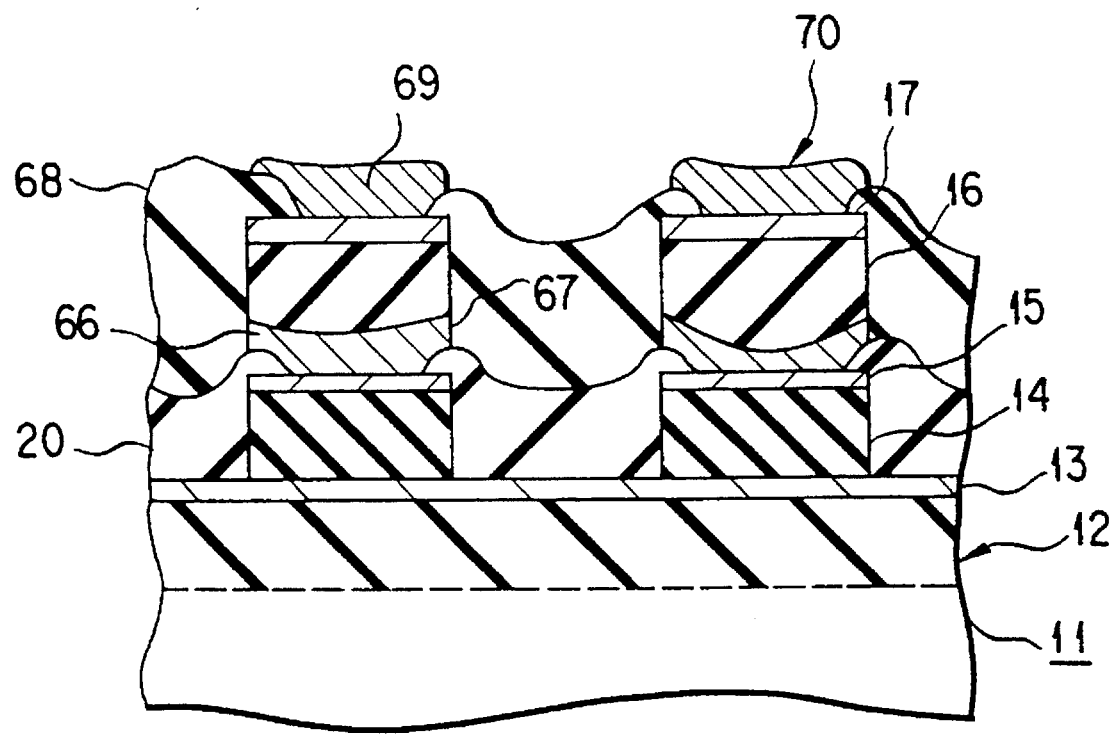
F I G. 8

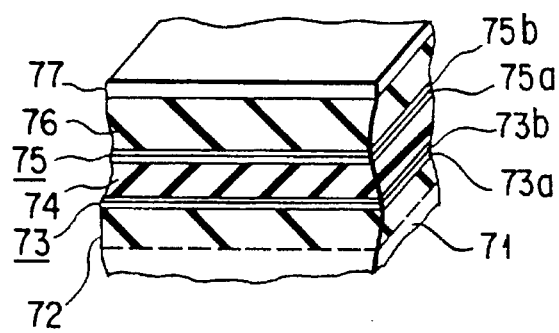
F I G. 9A
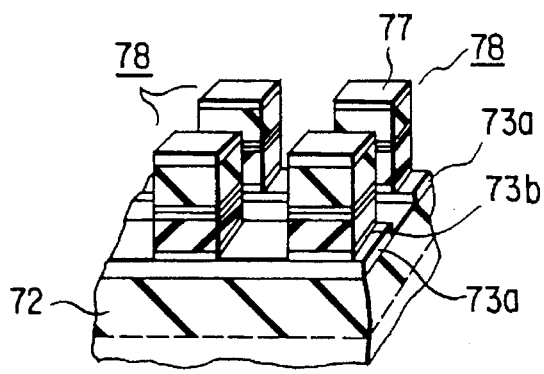
F I G. 9B
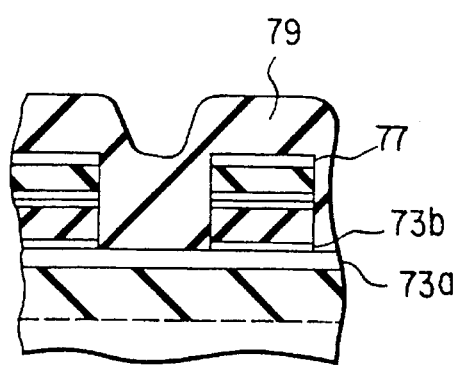
F I G. 9C
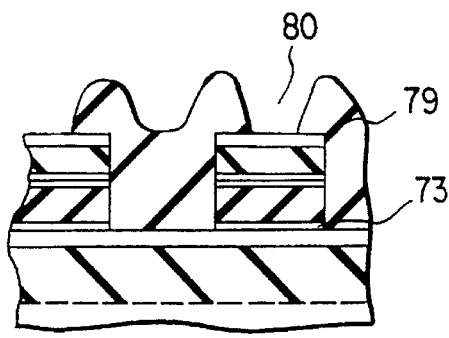
F I G. 9D
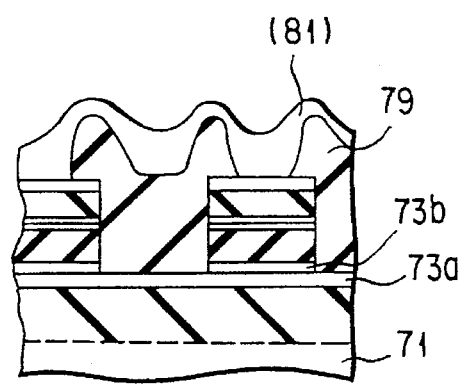
F I G. 9E
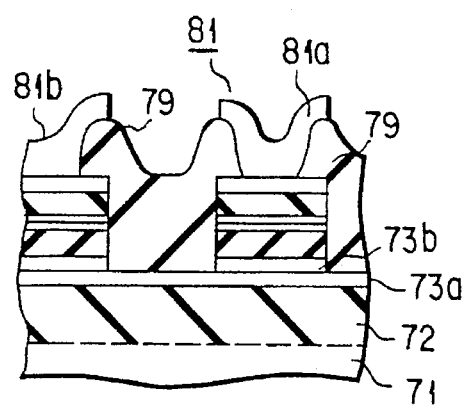
F I G. 9F

FERROELECTRIC MEMORY

BACKGROUND OF THE INVENTION

1. Field of the Invention

The present invention relates to a nondestructive readout nonvolatile memory using a ferroelectric thin film.

2. Description of the Related Art

In general, a ferroelectric substance for forming a ferroelectric thin film has a great piezoelectric effect, pyroelectric effect, electrooptic effect, acoustooptic effect, and nonlinear optic effect and is used for a nonvolatile memory, a sensor, a transducer, an actuator, an active optical element, a communication element, and the like.

One polarization characteristic of the ferroelectric substance is a hysteresis characteristic as shown in FIG. 11, and a ferroelectric memory using this characteristic is known. As shown in FIG. 11, when a voltage V is applied to the ferroelectric substance and then the ferroelectric substance is polarized, the residual polarization $-P_T$ or $P_T$ is maintained at point A or C even if the voltage is returned to "0". A digital signal "1" or "0" is applied to the residual polarization $-P_T$ or $P_T$ to serve the ferroelectric substance as a recording medium.

When information is recorded using the above polarization characteristic, a voltage Vs (saturation voltage), which is considerably higher than a resistant voltage Vc, is applied to the ferroelectric substance, and the signal "0" or "1" is recorded thereon.

If a positive readout pulse $V_A$ is applied to the ferroelectric substance in the recording state of "1", the polarization state changes from points A to C, and charges corresponding to a difference $2P_T$ between the polarizations at points A and C are removed. If the pulse Va is applied thereto in the recording state of "0", the polarization state changes from point C to point B and returns to point C, and a difference between the polarizations at points C and B is "0". Consequently, the recording state of "1" or "0" can be read out by detecting a number of charges generated when the pulse is applied.

FIG. 12A is a cross-sectional view of a conventional typical ferroelectric memory cell having an active matrix structure, and FIG. 12B is a circuit diagram which is equivalent to the memory cell.

The ferroelectric memory cell writes information to a ferroelectric capacitor 2 or reads out information from the capacitor when a MOS transistor 1 is turned on. The MOS transistor 1 includes an n⁺-type source region 3, an n⁺-type drain region 4, and a gate region. The ferroelectric capacitor 2 connected to the n⁺-type source region 3 of the MOS transistor 1 by aluminum wiring, includes a lower electrode 6 of Pt/Ti, a ferroelectric thin film 7 such as a PZT (lead zirconate titanate) film which is formed on the lower electrode 6 by using, for example, the solgelspinon coating technique and the MOCVD (Metal Organic Chemical vapor Deposition) technique, and an upper electrode 8 of Pt formed on the thin film 7.

A conventional ferroelectric memory includes a large number of ferroelectric memory cells arrayed in matrix, as shown in FIG. 13A, and was used as a memory cell array having a simple matrix structure. FIG. 13C is a circuit diagram which is equivalent to a 3×3 memory cell array having a simple matrix structure.

In the ferroelectric memory cell array shown in FIG. 13A, a pair of striped lower electrodes 6 and a pair of striped upper electrodes 8 are formed on, each of both surfaces of a substrate serving as a supporting body so as to cross each other. The ferroelectric thin film 7 is formed between the lower and upper electrodes 6 and 8. One memory cell is formed at each crossing point of the lower and upper striped electrodes 6 and 8. The ferroelectric memory described above is a so-called simple matrix type memory in which a desired memory cell is selected by applying a voltage V to the striped electrodes 6 and 8 and information is written to/read out from the selected memory cell.

When voltages ½ V and −½ V are applied to terminals A and B shown in FIGS. 13B and 13C, respectively, a voltage V appears across a memory cell $C_{32}$. When a storage state of the cell $C_{32}$ is read out, voltage ⅖ V appears across memory cells $C_{12}$, $C_{21}$, $C_{22}$ and $C_{33}$, and voltage ⅕ V appears across memory cells $C_{11}$, $C_{13}$, $C_{23}$ and $C_{31}$.

In the case of an n×n memory cell array, voltage $(n-1)/(2n-1)×V$ is applied to memory cells involved in a striped line to which voltages ½ V and −½ V are applied, and voltage $1/(2n-1)×V$ is applied to the other nonselective memory cells.

Even though an application voltage V is set so as not to invert the polarization of the ferroelectric memory cells, in other words, even though the voltage V is set not higher than a resistant voltage, the ferroelectric memory cells are depolarized so that the polarization state changes from points A to B' and then changes from points B' to A' after an electric characteristic is eliminated from the ferroelectric memory cell, as indicated by the dotted line in FIG. 11. This depolarization is remarkably typical of the ferroelectric substance. It is thus impossible to prevent the nonselective memory cells from being depolarized in the conventional ferroelectric memory having a simple matrix structure as shown in FIGS. 13A to 13C.

A memory having nonselective memory cells the storage states of which are not destroyed when a write or readout voltage V is applied to selected memory cells, is generally called a nondestructive ferroelectric memory. To achieve the nondestructive ferroelectric memory, a first method in which no voltage is substantially applied to a ferroelectric thin film using the nonlinear characteristic of antiferroelectrics, and a second method in which a thin-film structure having a metal-insulator-metal (MIM) function is used, are proposed. The first method is disclosed in Published Unexamined Japanese Patent Application No. 3-108192, and the second method is disclosed in Published Unexamined Japanese Patent Application No. 3-108769.

If the first method is applied to the conventional ferroelectric memory, a voltage applied to the nonselective memory cells is decreased, but the permittivity is still high, and the voltage applied to the nonselective memory cells is not so low as to prevent the cells from being depolarized completely.

If the second method is applied, a drawback is confirmed in which the operation time of an MIM switch is too long. The above two publications describe a basic structure of a memory for achieving the respective methods, but describe neither a specific structure of the memory nor a method of manufacturing the memory.

SUMMARY OF THE INVENTION

It is accordingly an object of the present invention to provide a nondestructive readout ferroelectric memory having a small capacitance even when a high-frequency voltage is applied and using a nonlinear resistance layer which stabilizes a threshold voltage and a nonlinear coefficient, and a method for manufacturing the same.

According to the present invention, there is provided a ferroelectric memory having a basic multilayer structure in which a multilayer unit memory cell of a ferroelectric thin film and a resistive thin film having a nonlinear voltage-current characteristic is arranged at each of intersections of X and Y striped electrodes which intersect each other at right angles and interpose the memory cell, wherein the unit memory cell has a multilayer structure including an upper striped electrode, an interlayer insulation film, a first electrode communicating with the upper striped electrode, a nonlinear resistor, a second electrode, a ferroelectric film, a lower striped electrode, a silicon oxide film, and a semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view of the entire arrangement of peripheral circuits for writing/reading information to/from the ferroelectric memory shown in FIG. 1;

FIG. 6 is a graph showing readout current response characteristics when a polarization state of the ferroelectric memory according to the first embodiment is "1" and "0";

FIGS. 7A and 7B are cross-sectional views each showing a structure of a nonlinear resistance layer of a ferroelectric memory (cell) according to a second embodiment of the present invention;

FIG. 8 is a cross-sectional view of a ferroelectric memory (cell) according to a third embodiment of the present invention;

FIGS. 9A to 9F are cross-sectional views showing a structure and a manufacturing process of a ferroelectric memory (cell) according to a fourth embodiment of the present invention;

DETAILED DESCRIPTION OF THE PREFERRED EMBODIMENTS

Embodiments of the present invention will now be described, with reference to the accompanying drawings.

Figure 1:
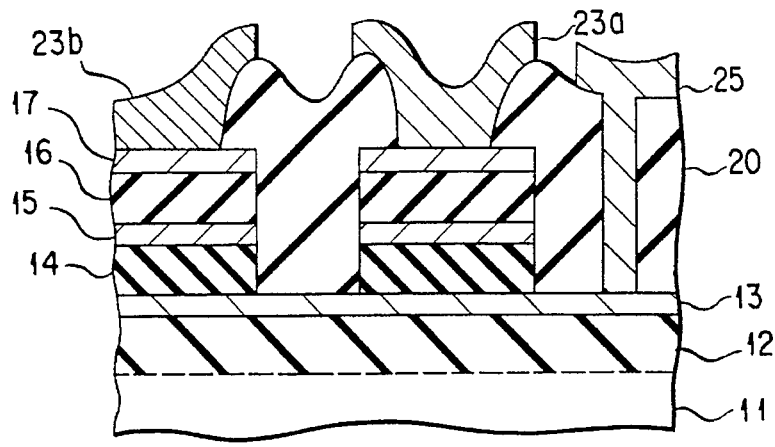
FIG. 1 is cross-sectional view of a ferroelectric memory (cell) according to a first embodiment of the present invention.

FIG. 1 shows a structure of a ferroelectric memory according to the first embodiment of the present invention.

In the ferroelectric memory shown in FIG. 1, an $SiO_2$ oxide layer 12 is formed on the surface of a silicon substrate 11 by thermal oxidation, and a lower striped electrode layer 13 is formed on the oxide layer 12. Each of the ferroelectric memory cells (unit memory cell) includes a PZT layer 14 of a ferroelectric thin film formed on the layer 13, a first upper electrode 15 formed on the PZT layer 14, a nonlinear resistance layer 16 formed on the electrode 15, a second upper electrode 17 formed on the layer 16, and upper striped electrodes 23a and 23b formed in a direction perpendicular to the lower striped electrode layer 13. The ferroelectric memory cells are electrically insulated from each other by interposing an insulator 20 between them.

Figure 2:
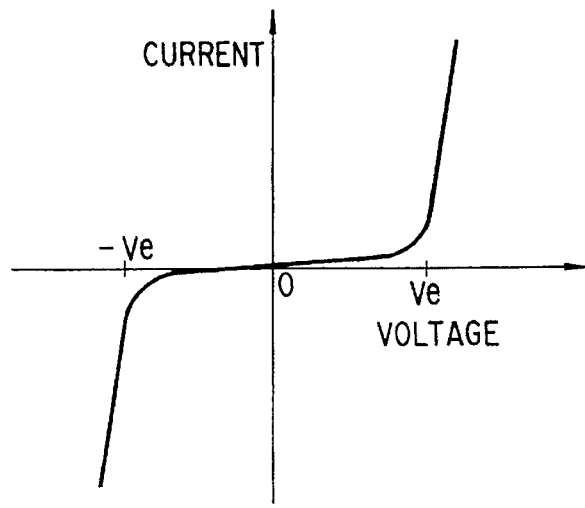
FIG. 2 is a graph showing a voltage-current characteristic of a nonlinear resistance layer.

The relationship between basic and memory characteristics of a ferroelectric layer will be described, based on the voltage-current characteristic of the nonlinear resistance layer, as shown in FIG. 2.

The voltage-current characteristics of the nonlinear resistance layer are symmetrical with regard to the origin (0, 0) of the coordinates, since the nonlinear resistance layer includes an odd-numbered multilayer having a $ZnO—Bi_2O_3$ layer which is interposed between two layers having the same characteristic or a polycrystalline layer formed by adding an additive, which will be described later, to a ZnO film.

Figure 3:
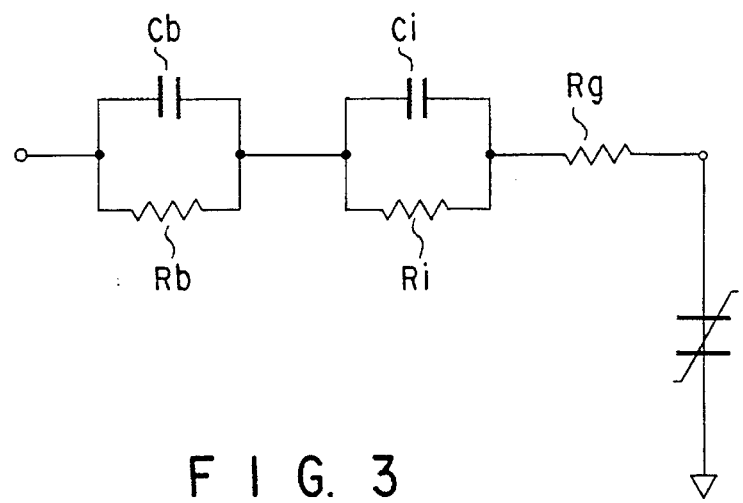
FIG. 3 is a view of a series-parallel circuit which is an equivalent circuit for the nonlinear resistance layer.

FIG. 3 shows a series-parallel circuit serving as an equivalent circuit for the nonlinear resistance layer. In FIG. 3, Rg indicates a resistance in polycrystalline grain which is usually several ohms, Rb denotes a direct-current resistance component of a grain boundary layer of several hundreds of ohms, and Cb represents a capacitance component of a grain boundary layer of about 500 pF. Furthermore, Ri shows an interface direct-current resistance component of $10^7$ to $10^8$ between grains and grain boundary, and Ci denotes an interface capacitance component of about 100 pF. In this nonlinear resistance layer, when an input signal (operation voltage) becomes not more than a threshold voltage Vth, an equivalent direct current resistance is greatly increased. Thus, a synthetic impedance depends on the equivalent capacitance Czno of the ZnO film.

An operation of the ferroelectric memory constituted by the nonlinear resistance layer and the ferroelectric thin film, will now be described.

An application voltage Vex is divided by the nonlinear resistance layer and the ferroelectric thin film having a capacitance of Cfe, and a voltage of Czno(Czno+Cfe)×Vex is applied to the ferroelectric thin film and a voltage of Cfe/(Czno+Cfe)×Vex is applied to the nonlinear resistance layer. The smaller Czno/Cfe, the lower the voltage applied to the ferroelectric thin film. Therefore, a nondestructive readout operation can effectively be performed.

When an external voltage is increased and the voltage Cfe/(Czno+Cfe)×Vex applied to the nonlinear resistance layer exceeds the threshold voltage Vth, the resistance of the nonlinear resistance layer is suddenly lowered and, at the same time, the voltage Zfe/(Zfe/Zzno)×Vex applied to the ferroelectric thin film is increased when the latter voltage is not lower than the resistant voltage Vc of the ferroelectric thin film, the polarization of the ferroelectric memory cell is inverted. To prevent the voltage from being applied to the ferroelectric thin film of a nonselective memory cell, the capacitance of the nonlinear resistance layer has to be reduced when the nonlinear resistance layer is turned off. Conventionally, when a nonlinear resistance layer is formed by a zinc oxide system, the additive thereof is able to vary the characteristics such as threshold voltage Vth, stability, and capacitance. In the present invention, too, the additive decreases the capacitance and improves the stability. Furthermore, in the structure of the ferroelectric memory of the present invention, an interlayer insulation layer is formed between the upper striped electrodes to make them insulated from each other; accordingly, a stable write/read operation can be performed.

FIGS. 4A to 4F show a specific structure of the ferroelectric memory according to the first embodiment of the present invention and a process of manufacturing the same.

Figure 4A:
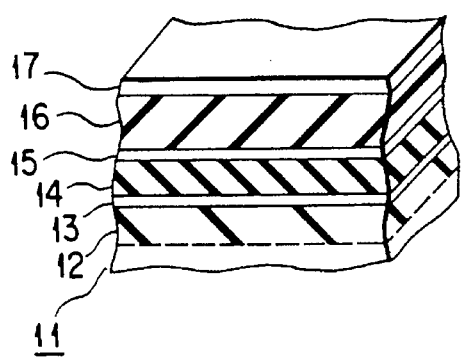
FIGS. 4A to 4F are cross-sectional views showing a structure and a manufacturing process of the ferroelectric memory according to the first embodiment of the present invention.

As shown in FIG. 4A, the surface of a silicon substrate 11 is thermally oxidized to form an oxide layer 12 thereon, and then a lower electrode layer 13 is formed on the entire surface of the oxide layer 12. The reason why the lower electrode layer 13 does not serve as a striped electrode from the beginning, is that a crack is easy to occur in a ferroelectric layer 14 such as a PZT (lead zirconate titanate) layer when the layer 14 is formed on the striped electrode by the solgelspinon coating technique.

The lower electrode layer 13 is thermally treated and spin-coated with the following metal alkoxide mixed solution to form the PZT layer:

| Pb: lead acetate/Pb(CH$_3$COO)$_2$ · 3H$_2$O | 1.03 mol |
| Zr: normal propoxide zirconium/Zr(On-Pr)$_4$ | 0.53 mol |
| Ti: isopropyltitanium/Ti(o-i-Pr)$_4$ | 0.47 mol |
| solvent: dimethoxyethanol/CH$_3$OCH$_2$H$_4$OH | |

When necessary, the alkoxide group can be replaced with the methoxy group or the buthoxy group, and the dimethoxyethanol can also be replaced with other alcohol. The ratio of the above mixed solution is determined to obtain a chemical composition of Pb$_{1.03}$(Zr$_{0.53}$Ti$_{0.47}$)O$_3$ and can be changed in accordance with a ration of Zr to Ti.

Furthermore, if DCCA, formamide NH$_2$CHO, dimethylformamide DMF(NH$_3$)$_2$CHO, or the like is added as a buffer solution to the mixed solution, a crack can be prevented from occurring.

Water the amount of which is 1.5 or less times as large as the total number of atoms of a metal ion and acetic acid the amount of which is equal to or less than that of atoms of the metal ion, both used for hydrolysis, are added to the above mixed solution directly before the lower electrode layer 13 is spin-coated with the mixed solution, and then the solution is agitated for 15 to 30 minutes at room temperature and applied to the lower electrode layer 13. The lower electrode layer 13 is then dried for 30 minutes at 250° C., and thermally treated in an oxygen atmosphere for 5 minutes at 500° to 800° C., thereby forming the PZT layer 14. After that, a first upper electrode layer 15 is formed on the entire surface of the PZT layer 14 by sputtering. To form a nonlinear resistance layer 16, one of the following metal alkoxide mixed solutions (1) and (2) is prepared:

| Solution (1) | |
| --- | --- |
| Zn: ethoxyethoxyzinc/Zn(OC$_2$H$_4$OE$_t$)$_2$ | 1.00 mol |
| Bi: ethoxyethoxybismuth/Bi(OC$_2$H$_4$OE$_t$)$_3$ | 0.05 mol |
| Co: ethoxyethoxycobalt/Co(OC$_2$H$_4$OE$_t$)$_2$ | 0.05 mol |
| Mn: ethoxyethoxymanganese/Mn(OC$_2$H$_4$OE$_t$)$_2$ | 0.05 mol |
| Cr: ethoxyethoxychromium/Cr(OC$_2$H$_4$OE$_t$)$_2$ | 0.05 mol |
| Sb: ethoxyethoxyantimony/Sb(OC$_2$H$_4$OE$_t$)$_3$ | 0.1 mol |
| Solution (2) | |
| Zn: diisopropoxyzinc/Zn(OC$_3$H$_7$)$_2$ | 1.00 mol |
| Bi: triisopropoxybismuth/Bi(OC$_3$H$_7$)$_3$ | 0.05 mol |
| Co: diisopropoxycobalt/Co(OC$_3$H$_7$)$_2$ | 0.05 mol |
| Mn: diisopropoxymanganese/Mn(OC$_3$H$_7$)$_2$ | 0.05 mol |
| Cr: chromiumacetylacetonate/Cr(C$_5$H$_7$O$_2$)$_3$ | 0.05 mol |
| Sb: triethoxyantimony/Sb(OC$_2$H$_5$)$_3$ | 0.1 mol |
| solvent: dimethoxyethanol/CH$_3$OCH$_2$H$_4$OH | |

As the case may be, another alkoxide group or another acetylacetonate compound can be used, and alcohol such as toluene and benzene can be used as the solvent. The ratio of the above mixed solution is determined to obtain a chemical composition of ZnO+2.5 mol % (Bi$_2$O$_3$+Cr$_2$O$_3$)+5 mol % (CoO+MnO+Sb$_2$O$_3$). The ratio of the mixed solution depends on the amount of each additive.

If DCCA, formamide NH$_2$CHO, dimethylformamide DMF(NH$_3$)$_2$CHO, or the like is added as a buffer solution to the mixed solution, a crack can be prevented from occurring water the amount of which is 1.5 or less times as large as the total number of atoms of a metal ion and acetic acid the amount of which is equal to or less than that of atoms of the metal ion, both used for hydrolysis, are added to the above mixed solution directly before the first upper electrode 15 is spincoated with the mixed solution, and then the solution is agitated for 15 to 30 minutes at a room temperature and applied to the entire surface of the first upper electrode 15. The first upper electrode 15 is then dried for 30 minutes at 250° C., and thermally treated in a mixed atmosphere of gaseous oxygen and gaseous nitrogen for 5 minutes at 500° to 800° C., thereby forming the nonlinear resistance layer 16. A second upper electrode layer 17 is then formed on the entire surface of the nonlinear resistance layer 16 by sputtering.

A ferroelectric memory device having a multilayer structure, as shown in FIG. 4A, is formed through the above process.

Figure 4B:
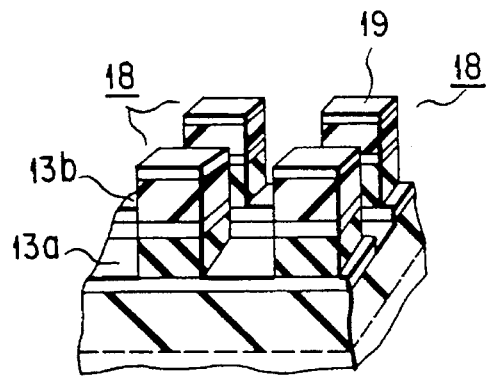

As shown in FIG. 4B, the device is etched in a striped fashion using an ion beam until the oxide layer 12 is exposed from the surface of the second upper electrode layer 17, and lower striped electrodes 13a and 13b are thus formed. The device is also etched in a striped fashion in a direction perpendicular to the lower striped electrodes 13a and 13b until the lower striped electrodes 13a and 13b are exposed from the surface of the second upper electrode layer 17. As a result, a number of square memory cells 18 each side of which corresponds to the width of each of the lower striped electrodes 13a and 13b, are arrayed in matrix.

Figure 4C:
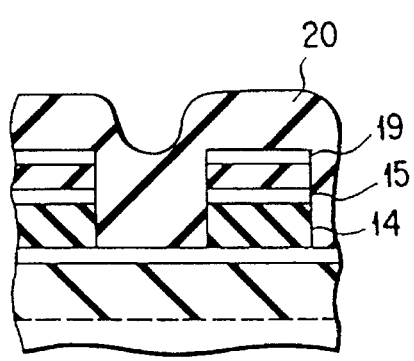

As shown in FIG. 4C, an interlayer insulation layer 20 of PSG, SiO$_2$, or Si$_3$N$_4$ is formed in a gap between the memory cells 18 and covers electrodes 19.

Figure 4D:
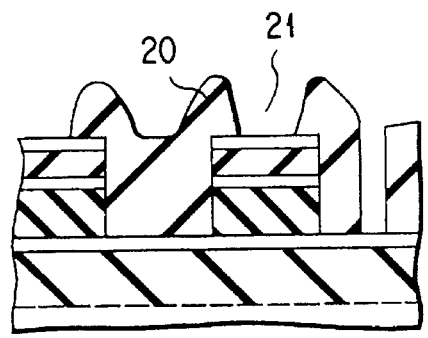
Figure 4E:
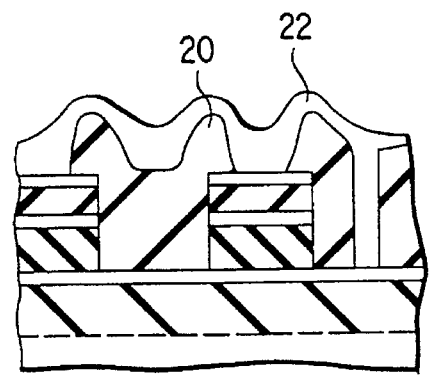

As shown in FIG. 4D, the interlayer insulation layer 20 is removed by photolithography so that the electrodes 19 are exposed from the surface of the interlayer insulation layer 20, thereby forming an opening (contact hole) 21. Then, a conductive wiring layer 22 is formed on all the surfaces of the resultant structure to fill the opening 21 in, as shown in FIG. 4E.

Figure 4F:
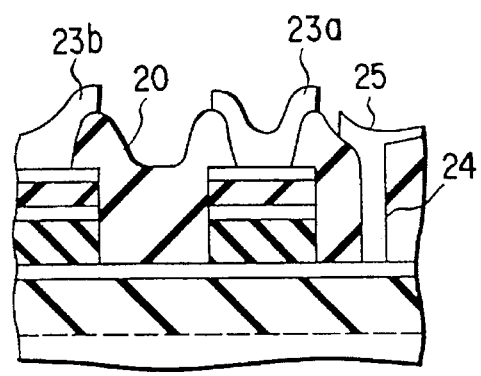

The conductive wiring layer 22 is removed in a striped fashion in a direction perpendicular to the lower striped electrode 13 to form upper striped electrodes 23a and 23b, as shown in FIG. 4F. At the same time, a contact hole 24 is formed at an end portion of the lower striped electrode 13, and a lead electrode 25 is formed to contact another member. More specifically, the lead electrode 25 is formed to connect the memory cell with an output of a decoder (shown in FIG. 5) formed on the silicon substrate 11 through the other manufacturing process. The end portions of the upper striped electrodes 23a and 23b are also connected to the decoder shown in FIG. 5.

FIG. 4 shows only the memory cells in a simple description. Actually, peripheral circuits such as the decoder for driving the memory cells are formed on the same silicon substrate 11 through the another manufacturing process.

A write/read operation of the memory will now be described, with reference to FIG. 5.

Column lines 33 of an X-direction decoder 32 and row lines 35 of a Y-direction decoder 34 are respectively connected to the upper and lower striped electrodes of each of the ferroelectric memory cells 18 of a memory cell array 31.

First, the write operation will be described.

The X-direction decoder 32 and Y-direction decoder 34 are driven in response to a CE signal 36 and an address signal 37 to select a memory cell 18, to which data is to be written, from the memory cell array 31. The X- and Y-direction decoders 32 and 34 have functions of supplying voltage signals of ±1/2 voltage generator 38 and ±½ voltage generator 39 for generating voltages of ±½ V and ±½ V, to the column lines 33 and row lines 35. These functions prevent a voltage from being applied to the column and row lines 33 and 35 connected to nonselective memory cells. The polarities of the voltages generated from the voltage generators 38 and 39 are determined by a polarity inverting circuit 40, and are opposite to each other.

When a signal "1" corresponding to ferroelectric polarization −Pr is written to the memory cell, an output signal of a sense amplifier 41 is supplied to the polarity inverting circuit 40 so that the polarity of the voltage generated from the ±½ V voltage generator 38 is negative and that of the voltage generated from the ±½ V voltage generator 39 is positive. When signal "0" corresponding to ferroelectric polarization +Pr is written to the memory cell, an output signal of a sense amplifier 41 is supplied to the polarity inverting circuit 40 so that the polarity of the voltage generated from the ±½ V voltage generator 38 is positive and that of the voltage generated from the +±½ V voltage generator 39 is negative. The output signal of the sense amplifier 41 is controlled in response to R/W signal 42 which is transmitted through a sense timing circuit 43.

Since the voltage V is applied to the selected memory cell 18 and the voltage applied to the ZnO nonlinear resistance layer is set to not lower than the threshold voltage Vth, data can be written to the selected memory cell 18. Voltage +½ V or −½ V at its maximum is applied to the nonselective memory cells connected to the column lines 33 or row lines 35. Since, in this case, the voltage applied to the ZnO nonlinear resistance layer is set lower than the threshold voltage Vth, the ferroelectric polarization does not change. Thus the write to only the selected memory cell 18 is completed.

Next, the read operation of the selected memory cell 18 will be described.

Whenever the read operation is performed, a positive pulse is generated from the ±½ V voltage generator 38, and a negative pulse is generated from the ±½ V voltage generator 39. Therefore, voltage +½ V or −½ V is applied to the nonselective memory cells connected to either the column line 33 or the row line 35 which are connected to the selected memory cell 18, and a voltage is hardly applied to the nonselective memory cells connected to the column line 33 nor row line 35.

When the storage state of the selected memory cell 18 is rendered "1" by the voltage +V applied to the selected memory cell 18, the ferroelectric polarization changes from −Pr to +Pr, because a voltage not lower than the resistant voltage Vc is applied to the ferroelectric thin film. Since it is the voltage +½ V or 0 V that is applied to the nonselective memory cells as described above, the ferroelectric polarization does not change.

When the storage state of the selected memory cell 18 is "0", the ferroelectric polarization starts from +Pr and returns to +Pr, with the result that the ferroelectric polarization does not change.

FIG. 6 shows readout current response characteristics when the ferroelectric polarization is "1" and "0". In FIG. 6, 50 indicates a response current when the ferroelectric polarization "1" is read out, and 51 denotes a response current when the polarization "0" is read out.

A value obtained by integrating the response current 50 with respect to time corresponds to an inverse charge when the ferroelectric polarization changes from −Pr to +Pr. An inverse current caused by the inverse charge is converted into a voltage by a load impedance 49, and the voltage is applied to the sense amplifier 41. When the voltage is higher than a reference voltage 48, it is determined as "1". When the voltage is lower than the reference voltage, it is determined as "0".

The response current 51 is a synthetic series capacitance of the capacitances (Cb and Ci shown in FIG. 3) of the ZnO nonlinear resistance layer which turns off and the linear capacitance Cfe of the ferroelectric thin film. The synthetic series capacitance is smaller than the nonlinear capacitance Cnfe of the ferroelectric thin film to a negligible extent. Using the structure and system shown in FIG. 5, the discrimination between "1" and "0" is very improved, which frees the present invention from the strictness of sense timing.

The rewrite operation of the selected memory cell 18 will be described

As described above, if the polarization of the ferroelectric memory ceil is inverted once, it cannot be returned to the original polarization unless any processing is executed. When the storage state of the selected memory cell 18 is "1", if it is read out by applying the voltage +V(>Vc) to the selected memory cell, the polarization changes from −Pr to +Pt. The storage state of the selected memory ceil 18 is thus destroyed.

A rewrite operation is performed to return the storage state of the selected memory cell to the original state. The rewrite operation can be performed if a readout signal of "1" (corresponding to the response current 50 shown in FIG. 6) is detected by the sense amplifier 41 to drive the polarity inverting circuit 40.

FIGS. 7A and 7B each show a structure of a nonlinear resistance layer of a ferroelectric memory according to a second embodiment of the present invention.

While the nonlinear resistance layer is formed by the solgelspinon coating technique in the first embodiment, it is formed by the sputtering technique. The nonlinear resistance layers shown in FIGS. 7A and 7B correspond to the nonlinear resistance layer 16 of the first embodiment shown in FIG. 4A.

As shown in FIG. 7A, a ZnO-0.5%MnO-0.5%CoO compound oxide layer 56 of the first layer is formed on an electrode layer 55 so as to bring them into ohmic contact with each other. This first layer 56 is formed in an oxygen atmosphere by the sputtering technique using an alloy of ZnO-0.5%MnO-0.5%CoO. It can also be formed by the sputtering technique using a compound oxide of ZnO-0.5%MnO-0.5%CoO.

Then, a $Bi_2O_3$-0.5%$Sb_2O_3$ compound oxide layer 57 of the second layer is formed on the first layer 56. This second layer 57 can De formed by the sputtering technique using either the aforementioned alloy or compound oxide. Further, a ZnO-0.5%MnO-0.5%CoO compound oxide layer 58 of a third layer is formed on the second layer 57, and an electrode layer 59 is formed on the third layer 58 so as to bring them into ohmic contact with each other. Consequently, the nonlinear resistance layer is formed as shown in FIG. 7A. Since the nonlinear resistance layer includes an even number of interfaces 60 and 61, the voltage-current characteristics of the nonlinear resistance layer are symmetrical with regard to the origin of the coordinates.

The nonlinear resistance layer shown in FIG. 7B includes a multilayer structure of a $Bi_2O_3$-0.5%$Sb_2O_3$ compound oxide layer 63, a ZnO-0.5%MnO-0.5%CoO compound oxide layer 64, and a $Bi_2O_3$-0.5%$Sb_2O_3$ compound oxide layer 65, and electrode layers 55 and 59 between which the multilayer structure is interposed. The order of the compound oxide layers shown in FIG. 7B is opposite to that of the layers shown in FIG. 7A, and the voltage-current characteristics of the nonlinear resistance layers shown in FIGS. 7A and 7B are the same. The nonlinear resistance layers shown in FIGS. 7A and 7B differ from each other only in structure and manufacturing process, and the structure of the memory device (memory cell array) of the second embodiment is the same as that of the memory device shown in FIG. 4F.

As described above, the nonlinear resistance layer has a three-layered structure of $Bi_2O_3$/ZnO/$Bi_2O_3$ or ZnO/$Bi_2O_3$/ZnO, an odd-numbered multilayer structure the middle layer of which is formed by ZnO or $Bi_2O_3$, or a structure containing an additive.

The characteristic of the nonlinear resistance layer common to the first and second embodiments is that a pn junction is formed by a p-type semiconductor oxide contacting an n-type semiconductor ZnO, and the p-type semiconductor oxide and the n-type semiconductor ZnO are formed one on another or have a polycrystalline structure including a pn junction at a grain boundary in a single layer. The pn junction can be formed by other materials, and the oxide thereof can be replaced with ZnS, etc.

FIG. 8 shows a structure of a ferroelectric memory according to a third embodiment of the present invention. In FIG. 8, the same structural elements as those in FIG. 4 are denoted by the same reference numerals and their descriptions are deleted.

The ferroelectric memory according to the third embodiment is formed by the following steps:

First step: an oxide layer 12 is formed on the surface of a memory element forming region by thermal oxidation and a lower electrode layer 13 on the entire surface of the oxide layer 12.

Second step: a PZT layer (ferroelectrics) 14 is formed on the entire surface of the lower electrode layer 13.

Third step: a first intermediate electrode layer 15 is formed on the entire surface of the PZT layer 14.

Fourth step: a first multilayer of the lower electrode layer 13, PZT layer 14, first intermediate electrode layer 15 is etched in a striped fashion in one direction to expose the surface of the oxide layer 12.

Fifth step: the striped first multilayer is also etched in a striped fashion in a direction perpendicular to the above direction to expose the surface of the lower electrode layer 13, thereby forming a number of first square cells arrayed in matrix.

Sixth step: an insulation layer 20 of PSG, $SiO_2$, etc. is formed so as to fill in gaps among the first square cells, and the resultant structure is etched to form a contact hole 66.

Seventh step: a contact electrode (lower electrode) 67, which contacts the upper electrode layer 15, is formed, and this contact electrode also serves as a lower electrode of a nonlinear resistance layer formed by the next step.

Eighth step: a nonlinear resistance layer 16 is formed on the entire surface of the lower electrode 67, and an upper electrode 17 is formed on the entire surface of the layer 16.

Ninth step: a second multilayer of the lower electrode 67, nonlinear resistance layer 16, and upper electrode 17 formed in the seventh and eighth steps, is etched to reach the insulation layer 20, as in the fifth step, thereby forming a number of second square cells.

Tenth step: a second insulation layer 68 is formed to fill in gaps among the second square cells, and a contact hole 69 is formed.

Eleventh step: an electrode is formed on the entire surface of the uppermost layer and etched to form an upper striped electrode 70 in a direction perpendicular to the lower striped electrode.

The ferroelectric memory device according to the third embodiment formed by the above manufacturing process, has an advantage in that a difference in level is small between the interlayer insulation film and the memory cells to reliably separate the memory cells.

In the ferroelectric memory device according to the first to third embodiments, the nonlinear resistance layer is formed on the ferroelectric thin film to form a ferroelectric memory cell array having a simple matrix structure. Thus, when the nonlinear resistance layer has a high resistance, that is, when it is turned off, the capacitance of the ferroelectric thin film is reduced, and there is no crosstalk among the memory cells. Furthermore, the ferroelectric thin film has a small linear capacitance by virtue of a write/read operation, and the recording state of the nonselective memory cells is not destroyed.

Consequently, a nondestructive readout ferroelectric memory having a small capacity even when a high-frequency voltage is applied and using a nonlinear resistance layer which stabilizes a threshold voltage and a nonlinear coefficient, and a method for manufacturing the same can be provided.

FIGS. 9A to 9F show a structure of a ferroelectric memory device according to a fourth embodiment of the present invention and a process of manufacturing the same.

As shown in FIG. 9A, the surface of a silicon substrate 71 is thermally oxidized to form a silicon oxide ($SiO_2$) layer 72, and then a buffer layer (not shown) of Ti, Cr, Mn, etc. for high cohesiveness. A lower electrode layer 73a of Pt and the like is formed on the entire surface of the buffer layer.

Furthermore, an electrode layer 73b of a metal such as Ni, Cu, Co and Cr an attribute of which is changed to a P type when it is changed to an oxide layer and which is not melted at a thermal processing temperature required when a ferroelectric thin film and a varistor thin film are formed, is formed on the lower electrode layer 73a.

A metal alkoxide compound mixing liquid (precursor) is applied to the electrode layer 73b, and the resultant structure is thermally treated in an atmosphere of 200° to 400° C. During this thermal processing, a varistor thin film 74 of $(Sr_{1-x}Ca_x)TiO_3+MeO$ is formed. The metal alkoxide compound mixing liquid is formed by the following:

| | |
|---|---|
| Sr: strontium acetate/$Sr(CH_3COO)_2 \cdot 3H_2O$ | 0.85 mol |
| Ca: calcium acetate/$Ca(CH_3COO)_2 \cdot 3H_2O$ | 0.15 mol |
| Ti: isopropyltitanium/$Ti(o-i-Pr)_4$ | 0.98 mol |
| Nb: penta-n-butoxyniobium/$Nb(OC_4H_9)_5$ | 0.02 mol |
| solvent: ethylalcohol + propyl alcohol | 10 wt % |

After the varistor thin film 74 is formed, the resultant structure is thermally treated for 30 minutes at a temperature of 500° to 800° C. in a mixed atmosphere of $N_2$ and $H_2$.

Like the lower electrode layer 73b, an upper electrode layer 75a of Ni, Cu, Co, or Cr is formed on the entire surface of the varistor thin film 74, and an layer 75b of Pt for the ferroelectric thin film is formed on the electrode layer 75a. A metal alkoxide compound mixing liquid (precursor) of $Pb(Zr \cdot Ti)O_3$ is applied to the electrode layer 75b, and the resultant structure is thermally treated in an atmosphere of 200° to 400° C., thereby forming a ferroelectric thin film 76. The metal alkoxide compound mixing liquid is formed by the following:

| | |
|---|---|
| Pb: lead acetate/$Pb(CH_3OO)_2$ | 1.05 mol |
| Ti: isopropyltitanium/$Ti(o-i-Pr)_4$ | 0.60 mol |
| Zr: isobutoxyzirconium/$Zr(OC_4H_9)_5$ | 0.40 mol |
| solvent: ethylalcohol + propyl alcohol | 10 wt % |

Then, the resultant structure is thermally treated for 30 minutes at a temperature of 500° to 800° C. in a mixing atmosphere of $N_2$ and $H_2$. An (uppermost) electrode 77 of Pt is formed on the entire surface of the ferroelectric thin film 76.

As shown in FIG. 9B, the structure is etched in a striped fashion in one direction using an ion-beam milling device so that the silicon oxide layer 72 is exposed. Further, the resultant structure is etched in a striped fashion in a direction perpendicular to the one direction so as to keep the lowermost striped electrode (lower electrode layer) 73a only. A number of memory cells 78 are therefore arrayed in matrix by this etching.

If Nb is applied to the electrode layer 75b, then penta-n-butoxyniobium/$Nb(OC_4H_9)_5$ can be used.

As shown in FIG. 9C, $SiO_2$ or $Si_3N_4$ is deposited by plasma CVD or normal-pressure CVD as an interlayer insulation layer 79 for electrically separating the memory cells. This deposition continues until the uppermost electrode 77 is coated. After that, a contact hole 80, which is slightly smaller than each memory cell and whose central point coincides with that of the memory cell, is formed by photolithography and etching as shown in FIG. 9D.

As shown in FIG. 9E, an aluminum layer 81 is formed on the entire surface of the resultant structure, and the structure is etched in a striped fashion in a direction perpendicular to the lower striped electrode 73a by photolithography, RIE, or wet etching, thereby forming upper striped electrodes 81a, 81b, ... 81n as shown in FIG. 9D. The ends of the lower and upper striped electrodes 73a and 81a which cross each other, are connected to the terminals of the peripheral circuits such as the decoders, the sense amplifier, etc.

Figure 10:
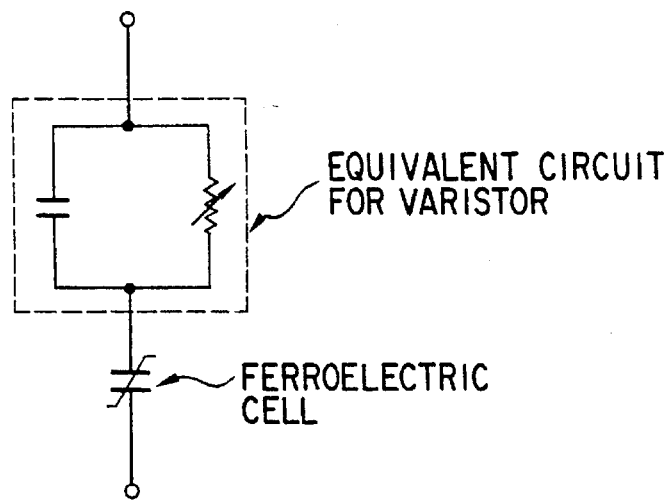
FIG. 10 is a circuit diagram of an equivalent circuit for the ferroelectric memory (cell) according to the fourth embodiment.
Figure 11:
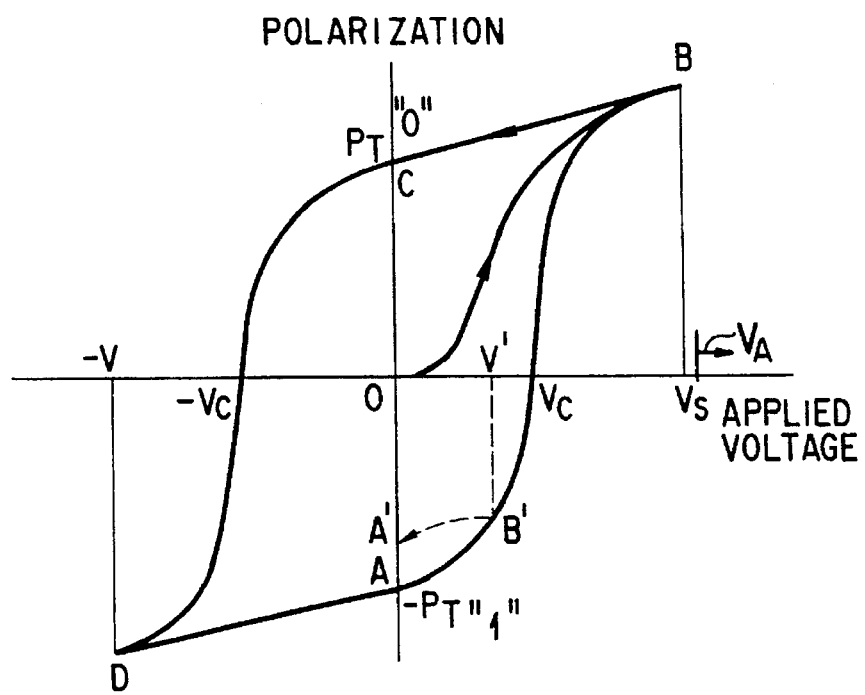
FIG. 11 is a graph showing a hysteresis characteristic of a ferroelectric substance.
Figure 12A:
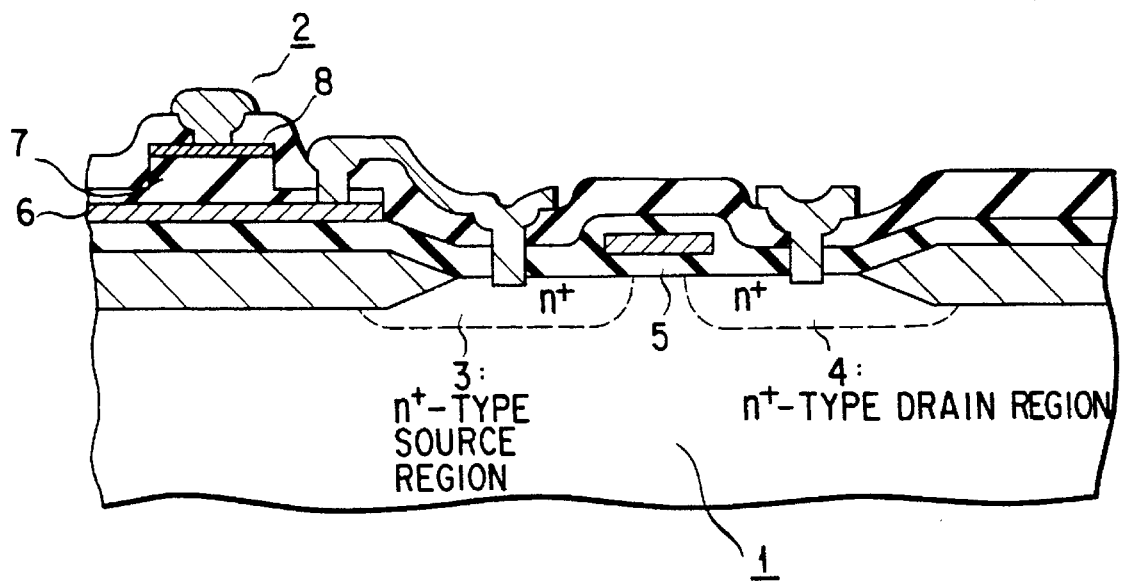
FIG. 12A is a cross-sectional view of a conventional ferroelectric memory (cell) having an active matrix structure.
Figure 12B:
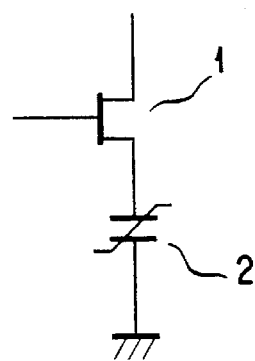
FIG. 12B is a circuit diagram of an equivalent circuit for the conventional ferroelectric memory (cell) shown in FIG. 12A.
Figure 13A:
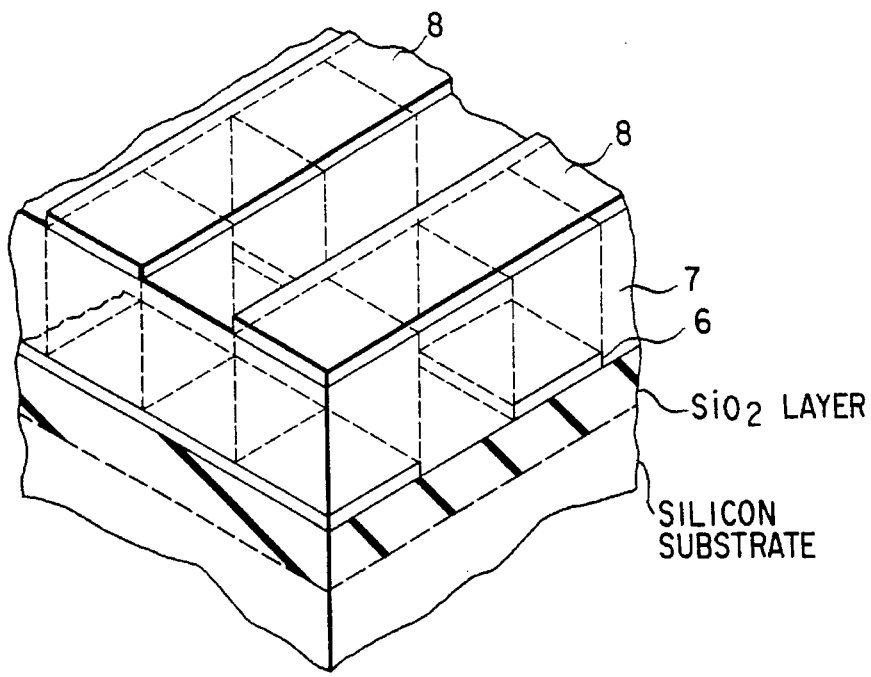
FIG. 13A is a cross-sectional view of a conventional ferroelectric memory (cell) having a simple matrix structure.
Figure 13B:
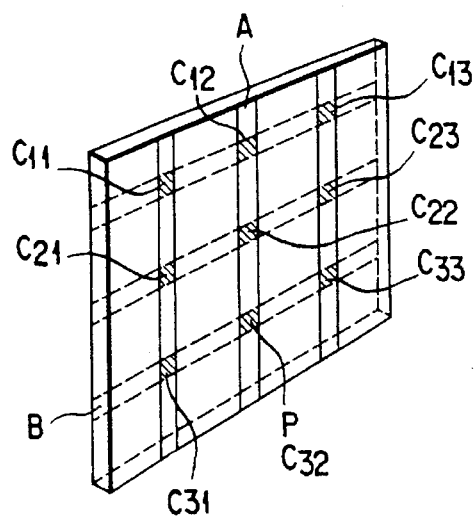
FIG. 13B is a view showing a ferroelectric memory cell array having a 3×3 simple matrix structure.
Figure 13C:
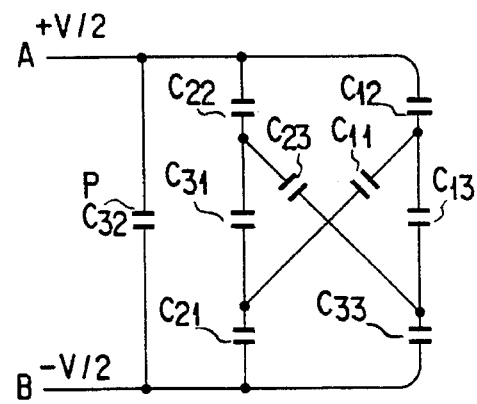
FIG. 13C is a circuit diagram showing an equivalent circuit for the memory cell.

The ferroelectric memory cell array of the fourth embodiment has the same simple matrix structure as that of the memory cell array of to the first embodiment. FIG. 10 shows an equivalent circuit of one ferroelectric memory cell of the memory cell array of the fourth embodiment. The write, readout, and rewrite operations of the ferroelectric memory cell (device) of the fourth embodiment are the same as those of the device of the first embodiment, and their descriptions are deleted.

The feature of the ferroelectric memory of the fourth embodiment lies in that not ZnO of an n-type semiconductor but strontium titanate ($SrTiO_3$) having high permittivity or $(Sr_{1-x}CaX)TiO_3$, which is obtained by substituting Ca for part of Sr of $SrTiO_3$, is used as a base material of a polycrystalline film having a nonlinear voltage-current characteristic. For this reason, the capacitance of an equivalent circuit for a layer formed of a material having the nonlinear voltage-current characteristic is large, and an electric field applied to the ferroelectric substance is increased accordingly. However, an electric field applied to the whole memory device can be decreased. The permittivity $\epsilon$ of $(Sr_{1-x}Ca_x)TiO_3$ is about 100, though it is influenced by X.

As for the permittivity of the ferroelectric substance, the PZT layer has a permittivity of about 1000, but it is not so high as to increase the voltage applied to the ferroelectric substance. In other words, a divided voltage applied to the ferroelectrics of the nonselective memory cells is not so increased as to exercise an influence.

Consequently, a high-density nonvolatile ferroelectric memory can be achieved which is formed of ferroelectric memory cells arrayed in simple matrix each having a great nonlinear voltage-current characteristic and a large current capacity.

The ferroelectric memory can be manufactured using a spin coat MOCVD technique and the like. Even though it is manufactured using this technique, the memory cells have similar crystal structure, and it is improbable that a chemical or physical mismatch in the interface will occur, with the result that the memory cells are improved in reliability.

In the present invention, the lower an oxygen partial pressure, the better the characteristics of the varistor thin film in its thermal treatment. The higher the oxygen partial pressure, the better the ferroelectricity of the ferroelectric thin film. It is desirable that the varistor thin film undergo the thermal treatment of low oxygen partial pressure and then that of high oxygen partial pressure, and the ferroelectric substance undergo the thermal treatment of high oxygen partial pressure. It is thus necessary to form the varistor thin film first and then the ferroelectric thin film.

If the oxygen partial pressure is too high when the ferroelectric thin film is thermally treated, the crystal structure of $(Sr_{1-x}CaX)TiO_3$ formed in the varistor thin film is damaged when the thermal treatment of low oxygen partial pressure is performed, and the varistor characteristic is degraded. The ferroelectricity is, however, improved even though the varistor characteristic is degraded. Therefore, the whole characteristics of the memory device do not vary so greatly. Since, therefore, a desired characteristic is obtained, without strictly controlling the precision of the oxygen partial pressure in the thermal treatment, the yield is improved.

The order of formation of the ferroelectric thin film and the varistor thin film is not limited to the above embodiment, but can be reversed. Moreover, the electrodes interposing the ferroelectric thin film are not limited to Pt, but can be formed of another metal.

Further, the multilayer structure of the memory cell is not limited to the above embodiment, but the memory cell can include a multilayer of upper striped electrode/interlayer insulation film/first electrode/ferroelectric thin film/lower striped electrode/silicon oxide film/semiconductor substrate.

In this way, the present invention is not limited to the above embodiments, but various changes and modifications can be made without departing from the scope and spirit of the invention.

According to the ferroelectric memory having the structure described above, strontium titanate ($SrTiO_3$) having high permittivity or $(Sr_{1-x}CaX)TiO_3$, which is obtained by substituting Ca for part of Sr of $SrTiO_3$, is used as a material of the polycrystalline film. Therefore, the capacitance of a capacitor of an equivalent circuit for the ferroelectric memory is increased, but a divided voltage applied to the ferroelectrics of the nonselective memory cells is not so increased as to exercise an influence.

The ferroelectric memory can be manufactured using a spin coat MOCVD technique and the like. Even though it is manufactured using this technique, the memory cells have similar crystal structure, and it is improbable that a chemical or physical mismatch in the interface of the layers will occur.

The characteristics of the varistor thin film and the ferroelectric thin film are opposite to each other. If the varistor characteristic is degraded by the oxygen partial pressure when the ferroelectric thin film is thermally treated, the ferroelectricity is improved. If the ferroelectricity is degraded, the varistor characteristic is improved. Thus, the whole characteristic does not vary so greatly, or the precision of the oxygen partial pressure in the thermal treatment need not be strictly controlled.

In the above embodiment, the solgel technique is used to form the ferroelectric thin film. However, the present invention is not limited to this technique. The sputtering, MOCVD, and MBE (Molecular Beam Epitaxy) techniques can be applied to all the ferroelectric! thin films having a perovskite structure containing lead and bismuth.

According to the above present invention described in detail, a high-density nonvolatile ferroelectric memory having a large current capacity and a great nonlinear voltage-current characteristic and capable of nondestructively reading/writing information from/to nonselective memory cells, and a method for manufacturing the same can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory-cell including:

a ferroelectric thin film electrically connected with one of the first stripe electrodes;

a nonlinear resistive thin film layer electrically connected with the ferroelectric thin film and with one of the second stripe electrodes, said nonlinear resistive thin film layer having an odd-numbered multilayer structure, said nonlinear resistive layer having a three-layered structure of respective layers of $Bi_2O_3$/$ZnO$/$Bi_2O_3$; and an intermediate electrode formed between the ferroelectric thin film and the nonlinear resistive thin film layer, said intermediate electrode being electrically connected with the ferroelectric thin film and with the nonlinear resistive thin film layer so as to electrically connect the nonlinear resistive thin film layer with the ferroelectric thin film.

2. The ferroelectric memory according to claim 1, wherein each of said first stripe electrodes includes:

a first layer selected from the group consisting of Ni, Cu, Co and Cr; and a second layer made of Pt.

3. The ferroelectric memory according to claim 1, wherein said intermediate electrode includes:

a first layer selected from the group consisting of Ni, Cu, Co and Cr; and a second layer made of Pt.

4. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:

a ferroelectric thin film electrically connected with one of the first stripe electrodes;

a nonlinear resistive thin film layer electrically connected with the ferroelectric thin film and with one of the second stripe electrodes, said nonlinear resistive thin film layer having an odd-numbered multilayer structure, said nonlinear resistive layer having a three-layered structure of respective layers of $ZnO$/$Bi_2O_3$/$ZnO$; and an intermediate electrode formed between the ferroelectric thin film and the nonlinear resistive thin film layer, said intermediate electrode being electrically connected with the ferroelectric thin film and with the nonlinear resistive thin film layer so as to electrically connect the nonlinear resistive thin film layer with the ferroelectric thin film.

5. The ferroelectric memory according to claim 4, wherein each of said first stripe electrodes includes:

a first layer selected from the group consisting of Ni, Cu, Co and Cr; and a second layer made of Pt.

6. The ferroelectric memory according to claim 4, wherein said intermediate electrode includes:

a first layer selected from the group consisting of Ni, Cu, Co and Cr; and a second layer made of Pt.

7. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:

a ferroelectric thin film electrically connected with one of the first stripe electrodes;

a nonlinear resistive thin film layer electrically connected with the ferroelectric thin film and with one of the second stripe electrodes, said nonlinear resistive thin film layer having an odd-numbered multilayer structure, said nonlinear resistive layer including layers of $Bi_2O_3$ and ZnO which are alternately formed, with a layer of ZnO in a middle of the multilayer structure; and an intermediate electrode formed between the ferroelectric thin film and the nonlinear resistive thin film layer, said intermediate electrode being electrically connected with the ferroelectric thin film and with the nonlinear resistive thin film layer so as to electrically connect the nonlinear resistive thin film layer with the ferroelectric thin film.

8. The ferroelectric memory according to claim 7, wherein each of said first stripe electrodes includes:

a first layer selected from the group consisting of Ni, Cu, Co and Cr; and a second layer made of Pt.

9. The ferroelectric memory according to claim 7, wherein said intermediate electrode includes:

a first layer selected from the group consisting of Ni, Cu, Co and Cr; and a second layer made of Pt.

10. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:

a ferroelectric thin film electrically connected with one of the first stripe electrodes;

a nonlinear resistive thin film layer electrically connected with the ferroelectric thin film and with one of the second stripe electrodes, said nonlinear resistive thin film layer having an odd-numbered multilayer structure, said nonlinear resistive layer including layers of ZnO and $Bi_2O_3$ which are alternately formed, with a layer of $Bi_2O_3$ in a middle of the multilayer structure, and an intermediate electrode formed between the ferroelectric thin film and the nonlinear resistive thin film layer, said intermediate electrode being electrically connected with the ferroelectric thin film and with the nonlinear resistive thin film layer so as to electrically connect the nonlinear resistive thin film layer with the ferroelectric thin film.

11. The ferroelectric memory according to claim 10, wherein each of said first stripe electrodes includes:

a first layer selected from the group consisting of Ni, Cu, Co and Cr; and a second layer made of Pt.

12. The ferroelectric memory according to claim 10, wherein said intermediate electrode includes:

a first layer selected from the group consisting of Ni, Cu, Co and Cr; and a second layer made of Pt.

13. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:

a ferroelectric thin film electrically connected with one of the first stripe electrodes;

a nonlinear resistive thin film layer electrically connected with the ferroelectric thin film and with one of the second stripe electrodes, said nonlinear resistive layer includes a polycrystalline thin film having a composition including strontium titanate ($SrTiO_3$) as a main ingredient and an additive for generating a donor; and an intermediate electrode formed between the ferroelectric thin film and the nonlinear resistive thin film layer, said intermediate electrode being electrically connected with the ferroelectric thin film and the nonlinear resistive thin film layer so as to electrically connect the nonlinear resistive thin film layer with the ferroelectric thin film.

14. The ferroelectric memory according to claim 13, wherein said polycrystalline thin film has a composition including $(Sr_{1-x}Ca_x)TiO_3$ serving as a main ingredient, which is obtained by substituting Ca for part of Sr of $SrTiO_3$.

15. The ferroelectric memory according to claim 13, further comprising:

a semiconductor substrate;

an insulation layer formed on the semiconductor substrate; and a buffer layer formed on the insulation layer, and said buffer layer being made of a material selected from the group of consisting of Ti, Cr and Mn; and wherein the first stripe electrodes are formed on the buffer layer.

16. The ferroelectric memory according to claim 13, wherein each of said first stripe electrodes includes:

a first layer selected from the group consisting of Ni, Cu, Co and Cr; and a second layer made of Pt.

17. The ferroelectric memory according to claim 13, wherein said intermediate electrode includes:

a first layer selected from the group consisting of Ni, Cu, Co and Cr; and a second layer made of Pt.

18. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:

a ferroelectric thin film electrically connected with one of the first stripe electrodes;

a nonlinear resistive thin film layer electrically connected with the ferroelectric thin film and with one of the second stripe electrodes; and an intermediate electrode formed between the ferroelectric thin film and the nonlinear resistive thin film layer, said intermediate electrode being electrically connected with the ferroelectric thin film and the nonlinear resistive thin film layer so as to electrically connect the nonlinear resistive thin film layer with the ferroelectric thin film, a semiconductor substrate;

a first insulation film formed on said semiconductor substrate;

an upper electrode formed on said nonlinear resistive layer; and a second insulation film formed on a portion of said upper electrode, and wherein:

said first stripe electrodes are formed on said first insulation film and extend in a given direction;

said ferroelectric thin films are arranged in a matrix, at predetermined intervals, on said first stripe electrodes;

said intermediate electrode is formed on the ferroelectric thin film;

said nonlinear resistive layer having a nonlinear resistive characteristic and being formed on said intermediate electrode; and said second stripe electrodes are electrically connected to said upper electrode and also have at least a portion thereof arranged on said second insulation film in a striped manner so as to extend in a direction perpendicular to the direction of said first stripe electrodes.

19. A ferroelectric memory comprising:

first stripe electrodes;

each of said first stripe electrodes includes:
a first layer selected from the group of consisting of Ni, Cu, Co and Cr; and
a second layer made of Pt;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes;
a nonlinear resistive thin film layer electrically connected with the ferroelectric thin film and with one of the second stripe electrodes; and
an intermediate electrode formed between the ferroelectric thin film and the nonlinear resistive thin film layer, said intermediate electrode being electrically connected with the ferroelectric thin film and the nonlinear resistive thin film layer so as to electrically connect the nonlinear resistive thin film layer with the ferroelectric thin film.

20. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes;
a nonlinear resistive thin film layer electrically connected with the ferroelectric thin film and with one of the second stripe electrodes; and
an intermediate electrode formed between the ferroelectric thin film and the nonlinear resistive thin film layer, said intermediate electrode being electrically connected with the ferroelectric thin film and the nonlinear resistive thin film layer so as to electrically connect the nonlinear resistive thin film layer with the ferroelectric thin film, said intermediate electrode includes:
a first layer selected from the group consisting of Ni, Cu, Co and Cr; and
a second layer made of Pt.

21. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes;
a nonlinear resistive thin film layer electrically connected with the ferroelectric thin film and with one of the second stripe electrodes, said nonlinear resistive layer is made of zinc oxide doped with Bi, Co, Mn, Cr and Sb; and an intermediate electrode formed between the ferroelectric thin film and the nonlinear resistive thin film layer, said intermediate electrode being electrically connected with the ferroelectric thin film and the nonlinear resistive thin film layer so as to electrically connect the nonlinear resistive thin film layer with the ferroelectric thin film.

22. The ferroelectric memory according to claim 21, wherein each of said first stripe electrodes includes:
a first layer selected from the group consisting of Ni, Cu, Co and Cr; and
a second layer made of Pt.

23. The ferroelectric memory according to claim 21, wherein said intermediate electrode includes:
a first layer selected from the group consisting of Ni, Cu, Co and Cr; and
a second layer made of Pt.

24. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes; and
a nonlinear resistive thin film layer electrically connected with the ferroelectric thin film and with one of the second stripe electrodes, said nonlinear resistive thin film layer having an odd-numbered multilayer structure, said nonlinear resistive thin film layer being made of metal oxide and said nonlinear resistive layer having a three-layered structure of respective layers of $Bi_2O_3/ZnO/Bi_2O_3$.

25. The ferroelectric memory according to claim 24, wherein each of said first stripe electrodes includes:

a first layer selected from the group consisting of Ni, Cu, Co and Cr; and a second layer made of Pt.

26. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes; and
a nonlinear resistive thin film layer electrically connected with the ferroelectric thin film and with one of the second stripe electrodes, said nonlinear resistive thin film layer having an odd-numbered multilayer structure, said nonlinear resistive thin film layer being made of metal oxide and said nonlinear resistive layer having a three-layered structure of respective layers of $ZnO/Bi_2O_3/ZnO$.

27. The ferroelectric memory according to claim 26, wherein each of said first stripe electrodes includes:

a first layer selected from the group consisting of Ni, Cu, Co and Cr; and a second layer made of Pt.

28. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes; and
a nonlinear resistive thin film layer electrically connected with the ferroelectric thin film and with one of the second stripe electrodes, said nonlinear resistive thin film layer having an odd-numbered multilayer structure, said nonlinear resistive thin film layer being made of metal oxide and said nonlinear resistive layer including layers of $Bi_2O_3$ and ZnO which are alternately formed, with a layer of ZnO in a middle of the multilayer structure.

29. The ferroelectric memory according to claim 28, wherein each of said first stripe electrodes includes:

a first layer selected from the group consisting of Ni, Cu, Co and Cr; and a second layer made of Pt.

30. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes; and
a nonlinear resistive thin film layer electrically connected with the ferroelectric thin film and with one of the second stripe electrodes, said nonlinear resistive thin film layer having an odd-numbered multilayer structure, said nonlinear resistive thin film layer being made of metal oxide, and said nonlinear resistive layer including layers of ZnO and $Bi_2O_3$ which are alternately formed, with a layer of $Bi_2O_3$ in a middle of the multilayer structure.

31. The ferroelectric memory according to claim 30, wherein each of said first stripe electrodes includes:

a first layer selected from the group consisting of Ni, Cu, Co and Cr; and a second layer made of Pt.

32. A ferroelectric memory comprising;

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes, and
a nonlinear resistive thin film layer electrically connected with the ferroelectric thin film and with one of the second stripe electrodes, said nonlinear resistive thin film layer is made of metal oxide, said nonlinear resistive layer includes a polycrystalline thin film having a composition including strontium titanate ($SrTiO_3$) as a main ingredient.

33. The ferroelectric memory according to claim 32, wherein said polycrystalline thin film has a composition including $(Sr_{1-x}Ca_x)TiO_3$ serving as a main ingredient, which is obtained by substituting Ca for part of Sr of $SrTiO_3$.

34. The ferroelectric memory according to claim 32, further comprising:

a semiconductor substrate;

an insulation layer formed on the semiconductor substrate; and a buffer layer formed on the insulation layer, and said buffer layer being made of a material selected from the group of consisting of Ti, Cr and Mn; and wherein the first stripe electrodes are formed on the buffer layer.

35. The ferroelectric memory according to claim 32, wherein each of said first stripe electrodes includes:

a first layer selected from the group consisting of Ni, Cu, Co and Cr; and a second layer made of Pt.

36. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
a ferroelectric thin film electrically connected with one of the first stripe electrodes;
a nonlinear resistive thin film layer electrically connected with the ferroelectric thin film and with one of the second stripe electrodes, said nonlinear resistive thin film layer being made of metal oxide; and an intermediate electrode disposed between the ferroelectric thin film and the nonlinear resistive thin film layer, said intermediate electrode includes:
a first layer selected from the group consisting of Ni, Cu, Co and Cr; and a second layer made of Pt.

37. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
- a ferroelectric thin film electrically connected with one of the first stripe electrodes;
- a nonlinear resistive thin film layer electrically connected with the ferroelectric thin film and with one of the second stripe electrodes, said nonlinear resistive thin film layer being made of metal oxide;

a semiconductor substrate;

a first insulation film formed on said semiconductor substrate;

an upper electrode formed on said nonlinear resistive thin film layer; and a second insulation film formed on a portion of said upper electrode, and wherein, said first stripe electrodes are formed on said first insulation film and extend in a given direction; and wherein
- said ferroelectric thin films are arranged in a matrix, at predetermined intervals, on said first stripe electrodes;
- an intermediate electrode is formed on the ferroelectric thin film; and
- said nonlinear resistive thin film layer having a nonlinear resistive characteristic is formed on said intermediate electrode; and
- said second stripe electrodes are electrically connected to said upper electrode and also have at least a portion thereof arranged on said second insulation film in a striped manner so as to extend in a direction perpendicular to the direction of said first stripe electrodes.

38. A ferroelectric memory comprising:

first stripe electrodes, each of said first stripe electrodes includes:
- a first layer selected from the group of consisting of Ni, Cu, Co and Cr; and
- a second layer made of Pt;

second stripe electrodes crossing the first stripe electrodes at a different height level from the first stripe electrodes;

a plurality of memory cells, each of said memory cells being arranged between the first and second stripe electrodes, and each memory cell including:
- a ferroelectric thin film electrically connected with one of the first stripe electrodes; and
- a nonlinear resistive thin film layer electrically connected with the ferroelectric thin film and with one of the second stripe electrodes; said nonlinear resistive thin film layer is made of metal oxide.

39. A ferroelectric memory comprising:

first stripe electrodes;

second stripe electrodes crossing the first stripe electrodes at a different height level from the first stripe electrodes;

a plurality of memory cells, each of said memory cells being arranged between the first and second stripe electrodes, and each memory cell including:
- a ferroelectric thin film electrically connected with one of the first stripe electrodes; and
- a nonlinear resistive thin film layer electrically connected with the ferroelectric thin film and with one of the second stripe electrodes, said nonlinear resistive thin film layer is made of metal oxide, said nonlinear resistive layer is made of zinc oxide doped with Bi, Co, Mn, Cr and Sb.

40. The ferroelectric memory according to claim 39, wherein each of said first stripe electrodes includes:
- a first layer selected from the group consisting of Ni, Cu, Co and Cr; and
- a second layer made of Pt.

41. A ferroelectric memory comprising:

first stripe electrodes;

second stripe electrodes crossing the first stripe electrodes at a different height level from the first stripe electrodes; and a plurality of memory cells, each of said memory cells being arranged between the first and second stripe electrodes, and each memory cell including:

a ferroelectric film electrically connected with one of the first stripe electrodes; and a metal oxide nonlinear resistive layer electrically connected with the ferroelectric film and with one of the second stripe electrodes, said nonlinear resistive layer being made of zinc oxide doped with Bi, Co, Mn and Sb.

42. The ferroelectric memory according to claim 41, wherein each of said first stripe electrodes includes:
- a first layer selected from the group consisting of Ni, Cu, Co and Cr; and
- a second layer made of Pt.

43. The ferroelectric memory according to claim 41, wherein each memory cell further comprises an intermediate electrode formed between the ferroelectric film and the nonlinear resistive layer, said intermediate electrode being electrically connected with the ferroelectric film and the nonlinear resistive layer so as to electrically connect the nonlinear resistive layer with the ferroelectric film.

44. The ferroelectric memory according to claim 43, wherein said intermediate electrode includes:
- a first layer selected from the group consisting of Ni, Cu, Co and Cr; and
- a second layer made of Pt.

* * * * *